Figure 1:
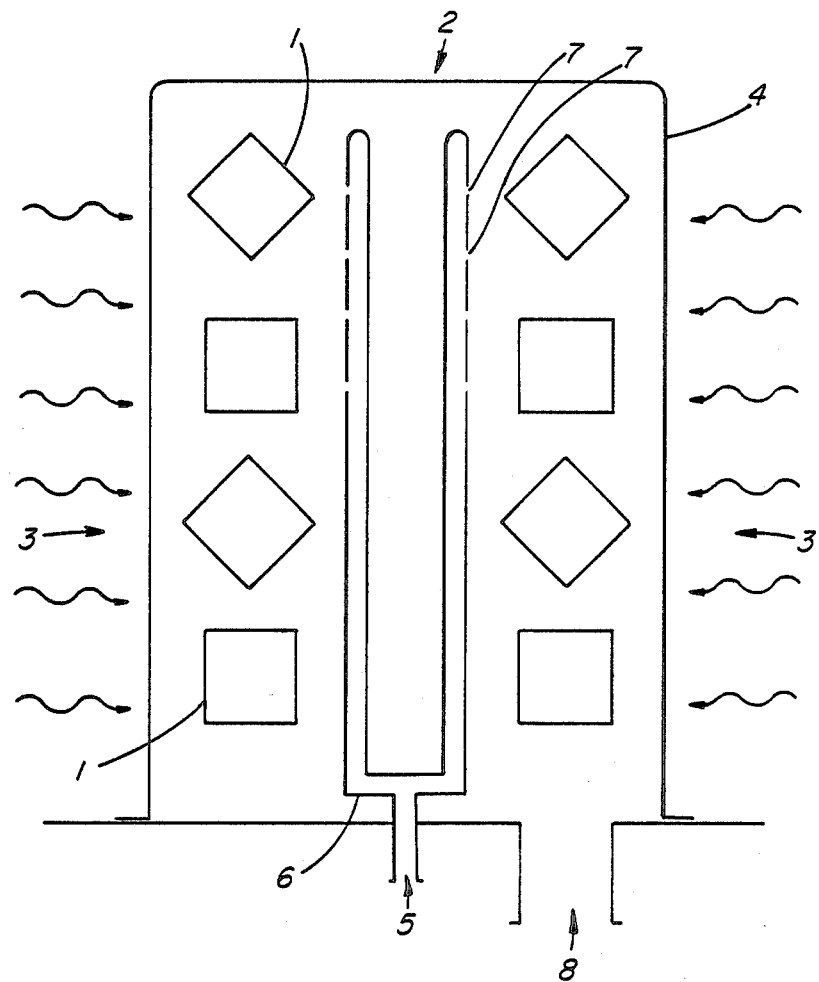

United States Patent [19]

Brien et al.

[11] Patent Number: 4,747,368
[45] Date of Patent: May 31, 1988

[54] CHEMICAL VAPOR DEPOSITION APPARATUS WITH MANIFOLD ENVELOPED BY COOLING MEANS

[75] Inventors: Guy Brien, Farnham; Richard Cloutier, Granby; Edward C. D. Darwall, Waterloo; Laszlo Szolgyemy, Bromont, all of Canada

[73] Assignee: Mitel Corp., Ontario, Canada

[21] Appl. No.: 35,032

[22] Filed: Apr. 6, 1987

Related U.S. Application Data

[63] Continuation of Ser. No. 778,238, Sep. 20, 1985, abandoned.

[30] Foreign Application Priority Data

May 17, 1985 [CA] Canada ................................... 481854

[51] Int. Cl.⁴ ............................................. C23C 16/00
[52] U.S. Cl. ..................................... 118/715; 118/719; 118/724; 118/725; 118/728; 118/733; 427/248.1
[58] Field of Search ............... 118/715, 719, 724, 725, 118/733, 728; 427/93, 95, 248.1, 255.1, 255.2, 255.3

[56] References Cited

U.S. PATENT DOCUMENTS

| | | | |
|---|---|---|---|
| 2,700,365 | 1/1955 | Pawlyk | 118/724 |
| 2,909,148 | 10/1959 | Patton et al. | 118/724 |
| 3,098,763 | 7/1963 | Deal et al. | 118/724 |
| 3,481,781 | 12/1969 | Kern | 427/255.3 |
| 3,818,982 | 6/1974 | Wagner | 118/724 |
| 3,862,397 | 1/1975 | Anderson et al. | 118/724 |
| 4,030,964 | 6/1977 | Schieber et al. | 118/719 |
| 4,047,496 | 9/1977 | McNeilly et al. | 118/725 |
| 4,167,915 | 9/1979 | Toole et al. | 118/724 |
| 4,315,479 | 2/1982 | Toole et al. | 118/724 |
| 4,545,327 | 10/1985 | Campbell et al. | 118/724 |
| 4,557,950 | 12/1985 | Foster et al. | 427/255.3 |
| 4,565,157 | 1/1986 | Brors et al. | 118/724 |

Primary Examiner—Sadie L. Childs
Attorney, Agent, or Firm—Antonelli, Terry & Wands

[57] ABSTRACT

A chemical vapor deposition apparatus for depositing films or coatings on semiconductor substrates. Substrates are supported within an air tight reactor and heated to a predetermined reaction temperature. A manifold disposed within the reactor, and having a plurality of openings therein, receives one or more reactive vapors and evenly distributes the vapors through the openings in the vicinity of the substrates, such that the vapors react at the substrate surfaces and a film or coating is deposited thereon. One or more cooling tubes substantially envelope the manifold, thereby maintaining the manifold at a temperature less than at least the reaction temperature such that the vapors do not prematurely react within the manifold. Hence, films and coatings are prevented from forming within the manifold, and sufficient unreacted vapors are supplied to the substrate to effect a satisfactory coating or film thereon.

14 Claims, 2 Drawing Sheets

CHEMICAL VAPOR DEPOSITION APPARATUS WITH MANIFOLD ENVELOPED BY COOLING MEANS

This application is a continuation application of application Ser. No. 778,238, filed Sept. 20, 1985 now abandoned.

This invention relates in general chemical vapor deposition apparatus, and more particularly to a cooled manifold for distributing reactive vapors in the vicinity of one or more substrates disposed within a reaction chamber.

Chemical Vapor Deposition (CVD) is a well known method for depositing films or coatings on substrates. The substrates are typically heated within a reaction chamber (commonly referred to as a reactor) to a predetermined suitable reaction temperature in an atmosphere comprised of one or more reactive vapors. The vapors are comprised of chemical compounds which react at the surfaces of the heated substrates, thereby depositing a film or coating thereon.

For instance, belljar type reactors are typically used to deposit hard coatings on substrates such as tools, optical glass, etc. Also, such reactors are well known for depositing various types of coatings on semiconductor substrates, as described in greater detail below.

The vapors are continuously introduced within the reactor, and spent vapors (i.e. gaseous reaction by-products) are continuously purged from the reactor in order to maintain constant circulation of reactive vapors across the surfaces of the substrates.

The substrates are heated according to well known methods such as heat conduction, radiation, inductance, etc. During mass production, a multiplicity of substrates are typically supported in a row utilizing a well known boat arrangement, which is placed into the reactor. The reactor is then typically heated by an external furnace such that heat radiates from the furnace through the reactor walls to the substrates. This arrangement is commonly known as a hot-wall CVD reactor.

Pressure is typically built up within the reactor due to the introduction of the reactive vapors such that spent vapors flow through an outlet port to an area of reduced pressure. Alternatively, an evacuation pump can be attached to the outlet port for maintaining low pressure within the reactor, in which case the reactor is known as a low pressure CVD system.

It is well known to use a manifold having a plurality of apertures or openings therein, for distributing the reactive vapors within the reactor. A manifold offers the advantage of uniform deposition onto all of the substrates. Indeed, there are some vapors which react so rapidly that reasonable uniform deposition cannot be achieved without use of the manifold, as described in greater detail below.

However, since the manifold is disposed within the reactor, it is heated to approximately the same temperature as the substrates. Hence, the reactive vapors have been known to prematurely react within the manifold causing deposition on internal walls thereof. This premature reaction results in exhausted or spent vapors being circulated across the substrates causing unsatisfactory deposition of the films or coatings thereon.

In CVD systems utilizing a mixture of vapors, one vapor is typically more reactive than the others. The more reactive vapor decomposes more readily in the hot manifold than the other ones, resulting in an altered vapor mixture being applied to the substrates. Consequently, a film is deposited on the substrates which is deficient in the component of the more reactive vapor which has been prematurely deposited on the internal walls of the manifold.

A further disadvantage of hot manifolds is that the film which develops on the internal walls can grow to substantial thicknesses which alter the internal dimensions of the manifold and the apertures or openings through which the vapors are distributed to the reactor. This can result in uneven distribution of the reactive vapors in the vicinity of the substrate.

According to the present invention, a cooled manifold is utilized which eliminates the aforementioned disadvantages of prior art hot manifolds, and yields good deposition uniformity and control of film composition on the substrates.

In general, the invention is a chemical vapor deposition apparatus, comprised of an airtight reactor, structure for supporting one or more substrates having exposed surfaces within the reactor, apparatus for heating the substrates to a predetermined reaction temperature, and a manifold disposed within the reactor, for receiving one or more reactive vapors and having a plurality of openings therein for evenly distributing the received vapors in the vicinity of the substrates, whereby the vapors react at the substrate surfaces at the predetermined reaction temperature causing a film to be deposited thereon. The invention further includes apparatus for evacuating spent vapors from the reactor, and cooling apparatus substantially enveloping the manifold, for circulating cooling fluid therearound, thereby maintaining the manifold at a temperature less than at least the reaction temperature such that the reactive vapors do not prematurely react within the manifold.

The invention is also a chemical vapor deposition process, comprising the steps of heating one or more substrates supported within an airtight reactor to a predetermined reaction temperature, receiving one or more reactive vapors within a manifold, cooling the vapors within the manifold to a temperature less than at least the reaction temperature, whereby the cooled vapors are prevented from prematurely reacting within the manifold, distributing the vapors from within the manifold evenly in the vicinity of the substrates such that the vapors react at the reaction temperature to form a deposition layer on the substrates, and evacuating spent vapors from the reactor.

Figure 2:
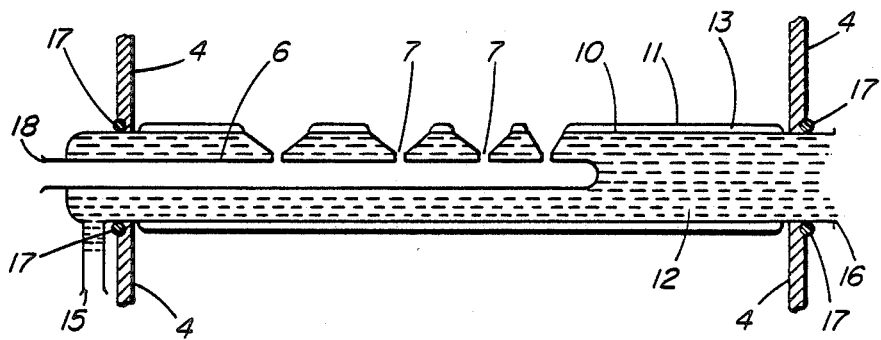
Figure 3:
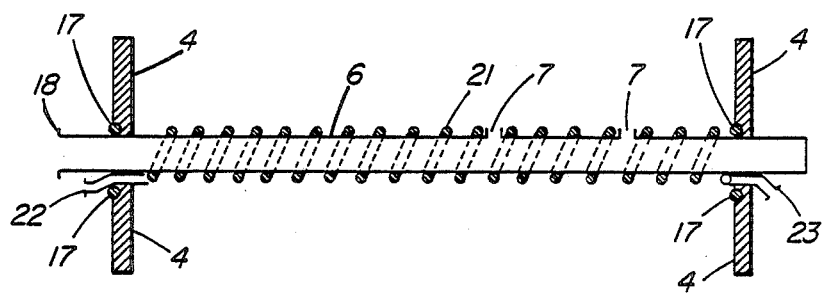
Figure 4:
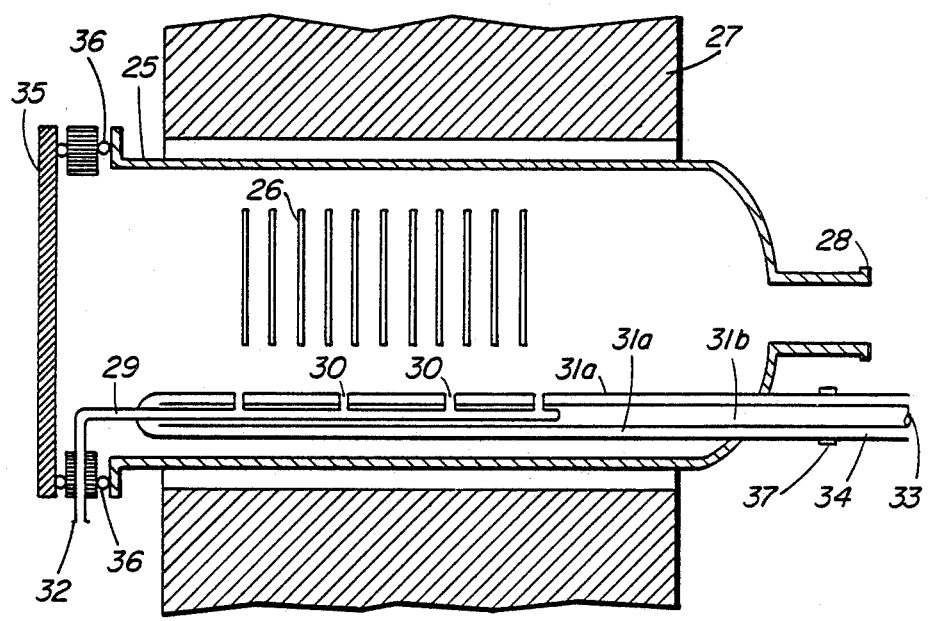

A better understanding of the present invention will be obtained with reference to the detailed description below, in conjunction with the following drawings in which:

FIG. 1 is a cross-sectional view of a reactor, manifold and substrates according to the prior art, FIG. 2 is cross-sectional view of a manifold arrangement according to a first embodiment of the invention, FIG. 3 is a cross-sectional view of a manifold arrangement according to a second embodiment of the invention, and FIG. 4 is a cross-sectional elevation of a preferred embodiment of the invention.

FIG. 1 illustrates a plurality of substrates 1 supported inside a belljar reactor shown generally as 2, by an appropriate fixture (not shown) such as the aforementioned boat arrangement. The substrates are comprised of tools, optical glass or semiconductors, as described above. Heating apparatus 3 such as a furnace or a plurality of heating tubes, is disposed outside a wall 4 of the reactor 2 for heating the reactor wall 4 which in response radiates heat to the substrates 1. The reactive vapors, shown generally as 5, enter a manifold 6 having a plurality of openings or apertures 7 disposed therein. The vapors escape through openings 7 and react at the surface of the substrates 1 causing a film to be deposited thereon. Spent vapors are extracted through an output port 8, thereby providing a continuous flow of reactive vapors over the substrates 1.

As described herein above, the manifold 6 is typically heated to approximately the temperature within the reactor 2 such that typically the reactive vapors 5 prematurely react to deposit a film on the inner walls of manifold 6 such that exhausted or spent vapors pass through openings 7, causing non-uniform film deposition on the substrates 1.

With reference to FIG. 2, a manifold arrangement is shown comprised of a tubular manifold 6 surrounded or enveloped by two concentric tubes 10 and 11 which are collapse-welded together around manifold openings or apertures 7 of the manifold 6. During construction, holes are typically drilled through the collapse-welded tubes in order to define the manifold openings 7. Cooling fluid shown generally as 12, flows in a space between the tubular manifold 6 and adjacent concentric tube 10, entering at an inlet contact 15 and flowing out through an exit contact 16. The space between concentric tubes 10 and 11 is typically evacuated and serves as a heat insulator. The tube 10 is sealed between end walls 4 of the reactor (such as reactor 2 shown in FIG. 1) with a suitable seal, for example "O" rings 17.

In operation, reactive vapors enter into manifold 6 at contact 18 and are distributed through openings 7 for reaction on the surfaces of substrates disposed in the vicinity thereof, as shown and described with reference to FIG. 1. The cooling fluid 12 is circulated around the manifold 6, thereby maintaining the temperature of reactive vapors therein at a predetermined temperature less than the reaction temperature of the vapors.

Heat insulating tube 11 can be omitted in the event the heat transfer from the reactor (reactor 2 in FIG. 1) towards the manifold arrangement is negligible, a condition which is frequently satisfied. Heat conducted by the vapors inside the reactor is small, particularly in low pressure reactors. This heat conduction in most cases is sufficiently small that the vapor atmosphere immediately surrounding the manifold arrangement acts effectively as a heat insulating sheath through which only radiated heat passes, thereby eliminating the necessity for heat insulating tube 11, as discussed in greater detail below with reference to the preferred embodiment illustrated in FIG. 4. However, in the event the heat transfer to the manifold arrangement is not negligible (i.e. if the ratio of reactor surface area to manifold surface area is not sufficiently large), the heat insulating tube 11 is required.

FIG. 3 illustrates a further manifold arrangement wherein both ends of tubular manifold 6 extend through the reactor walls 4. A helical cooling tube 21 is wound around the manifold 6 leaving vapor distribution openings 7 uncovered. Cooling fluid enters tube 21 through an inlet 22 externally of the reactor walls 4, and exits via an outlet 23. "O" rings 17 extend around the inlet and outlet portions of the tube 21 and the ends of the manifold 6 to ensure a gas tight seal within the reactor 2, (FIG. 1).

Reactive vapors enter manifold 6 through contact 18 for distribution through openings 7, as discussed above. Cooling fluid flows within helical tube 21, maintaining the reactive vapor within manifold 6 at a predetermined temperature less than at least the reaction temperature of the reactive vapors.

The cooled manifold according to the present invention, is particular useful in hot-wall CVD systems, as illustrated by the following example.

EXAMPLE

Boro-Phosphoro-Silica-Glass (BPSG) deposition from the hydrides of boron ($B_2H_6$), phosphorous ($PH_3$), and silicon ($SiH_4$) is well known and widely used in the semiconductor device fabrication industry. Typically, silicon substrates are placed in a row along the axis of a tubular reactor and supported in a partially closed boat arrangement. A manifold extends along the length of the reactor, delivering oxygen to the wafers. A further similar manifold distributes the aforementioned hydrides. The gas pressure within the tubular reactor is typically reduced to less than one torr by removing spent vapors with a vacuum pump. The tubular reactor is typically heated in a tubular furnace to a temperature of from 300° C. to 450° C.

The hydrides of silicon ($SiH_4$) and phosphorous ($PH_3$) are stable at the reactor temperature of 300° C. to 450° C. in any mixed ratio. However, the hydride of boron ($B_2H_6$) decomposes to boron and hydrogen at temperatures of 200° C. or greater. Thus, flowing a mixture of $SiH_4$ and $B_2H_6$ with or without $PH_3$ vapor along a hot manifold results in a metallic boron-reach deposition on internal walls of the manifold. Decomposition of $B_2H_6$ is sufficiently rapid at temperatures of 200° C. or greater that only a very small amount remains undecomposed and passes through openings in the manifold to reach the silicon substrates.

It has been found that BPSG deposition is inefficient and difficult to control in well known prior art hot-wall CVD reactors when using the hydride of boron ($B_2H_6$). However, by utilizing the cooled manifold of the present invention, BPSG deposition with a controlled composition of the hydrides can be achieved efficiently and accurately.

With reference to FIG. 4, a preferred embodiment of the present invention is shown. A reactor tube 25 (typically fabricated from quartz), houses a plurality of substrates 26 and is disposed within a cylindrical furnace 27 and heated therein to a temperature of from 300° C. to 450° C. An outlet port 28 of the reactor tube 25 is typically connected to an evacuation pump, (not shown), for evacuating spent or exhausted vapors. A hydride manifold 29 has vapor distributing openings 30 deposited therein, in the vicinity of the substrates, ensuring an even supply of vapors to the substrates and uniform deposition thereon. An oxygen manifold (not shown) is placed beside the hydride manifold in a well known manner.

A pair of concentric tubes 31A and 31B envelope the hydride manifold 29, and have apertures therein coterminous with the vapor distributing openings 30.

A loading door assembly 35 is provided for inserting and removing substrates 26 and is maintained in sealed relation to the reactor tube 25 via a well known seal such as "O" rings 36. Also, a vacuum tight seal 37 seals the pair of concentric tubes 31A and B to the quartz reactor tube 25.

In operation, the hydride vapor mixture enters the manifold 29 at contact 32 and is expelled through openings 30. The hydride vapor mixture reacts with the oxygen at the surfaces of the substrates 26, forming a coating thereon as discussed above.. The spent vapors are expelled through outlet port 28 in response to operation of the evacuation pump. Cooling fluid flows through the concentric tubes 31A and 31B entering at port 33 and flowing out contact 34, thereby cooling the boron hydride vapor ($B_2H_6$) to a temperature less than at least 200° C.

It has been found that heat transfer in hot-wall CVD reactors is almost entirely by radiation, even at low temperatures such as 330° C. Because heat radiation-absorption is proportional to surface area, a small surface manifold arrangement absorbs only a small amount of heat. Hence, as discussed above with reference to FIG. 2, it has been found that a large reactor surface area to manifold surface area ratio is important for maintaining uniform temperature within the reactor.

According to a successful prototype of the invention, the ratio of the inner surface area of reactor tube 25 to the surface area of the manifold arrangement (i.e. manifold 29 surrounded by concentric tubes 31A and B), was approximately 100. In other words, the diameter of the reactor tube 25 was approximately 10 times that of the manifold arrangement. It was found that heat absorption of the cooled manifold arrangement from the ambient atmosphere surrounding it was negligible. In particular, using water as the cooling fluid, flowing at a rate of one liter per minute within the concentric tubes 31A and B, the temperature increase of the water was found to be less than 25° C. at a reactor temperature of 400° C. Hence, there was minimal heat absorption, such that no additional heat insulation (such as concentric tube 11 in FIG. 2) was required around the concentric tubes 31A and B. Temperature uniformity in the vicinity of the substrates was negligibly altered in the presence of the cooled manifold arrangement.

In addition, it was found that no appreciable deposition occurred on the inner surface of the cooled manifold 29. In fact, it was found that the deposited film composition on the substrates 26 was directly proportional to the original gas composition entering the manifold 29 via contact 32.

Prior art manifolds were typically fabricated from transparent material such as quartz. It has been found that infrared photons are typically transmitted through the prior art manifolds and absorbed by the reactive vapors. In response, the vapors typically become energized to above the thermal energy level within the manifolds, thereby accelerating chemical vapor deposition and causing premature reaction of the vapors. It has been found that fabricating the manifold arrangement with a photon reflecting material (such as stainless steel), or using a cooling fluid having the ability to absorb the photons, significantly reduces deposition inside the manifold. For practical purposes water has been found to exhibit adequate photon absorbing characteristics.

Numerous other variations or alternative embodiments may now be conceived of by a person skilled in the art understanding the present invention.

For instance, while the above described EXAMPLE illustrates use of the present invention for effecting Chemical Vapor Deposition using particular compounds, the invention is not restricted to use with those compounds, and numerous other films or coatings can be advantageously deposited according to the present invention. For instance, the invention can be used to apply doped polysilicon coatings, wear and corrosion resistant boron film coatings, or aluminum coatings reacted from triisobutilaluminum to one or more substrates. Alternatively, intermetallic semiconductors (gallium arsenide, gallium phosphide, etc.) can be reacted from metalorganic compounds [$Ga(CH_3)_3$, $Al(C_2H_5)_3$, etc.] and deposited on the substrates.

These and all other embodiments or variations in design using the principles disclosed herein are considered to be within the sphere and scope of the invention as defined in the claims appended hereto.

We claim:

1. Chemical vapor deposition apparatus, comprised of:
   (a) an airtight reactor,
   (b) means for supporting one or more substrates having exposed surfaces within said reactor,
   (c) means for heating said substrates to a predetermined reaction temperature,
   (d) manifold means disposed within said reactor, for receiving one or more reactive vapors, and having a plurality of openings therein for evenly distributing said received vapors in the vicinity of said substrates,
   whereby said vapors react at said substrate surfaces at said predetermined reaction temperature causing a film to be deposited thereon, and
   (e) means for evacuating spent vapors from said reactor, the improvement comprising
   (f) cooling means in direct contact with and substantially enveloping said manifold means, for circulating cooling fluid therearound, said cooling means being adapted to leave said plurality of openings uncovered, thereby maintaining said manifold means at a temperature less than at least said reaction temperature such that said reactive vapors do not prematurely react within the manifold means.

2. Chemical vapor deposition apparatus as defined in claim 1, wherein said manifold means and cooling means are fabricated from heat reflecting material.

3. Chemical vapor deposition apparatus as defined in claim 1, wherein said cooling fluid has sufficient heat capacity for absorbing heat generated by said means for heating.

4. Chemical vapor deposition apparatus as defined in claim 1, wherein said cooling means is comprised of a first concentric tube surrounding said manifold means and collapse-welded together with said manifold means around said plurality of openings, for defining a space through which said cooling fluid is circulated.

5. Chemical vapor deposition apparatus as defined in claim 1, wherein said cooling means is comprised of a first concentric tube surrounding said manifold means for defining a space through which said cooling fluid is circulated, and a second concentric tube surrounding said first tube for defining an evacuated space between said first and second tubes for providing heat insulation between said first tube and said means for heating, said first and second concentric tubes being collapse-welded together with said manifold means around said plurality of openings.

6. Chemical vapor deposition apparatus as defined in claim 1, wherein said cooling means is comprised of a helical tube wrapped around said manifold means, for circulating said cooling fluid therethrough.

7. Chemical vapor deposition apparatus as defined in claim 1, wherein said cooling means is comprised of a pair of concentric tubes surrounding said manifold means and having a plurality of apertures therein coterminous with said plurality of openings, for defining concentric flow paths through which said cooling fluid is circulated around said manifold means.

8. Chemical vapor deposition apparatus as defined in claim 1, wherein said cooling fluid is water.

9. Chemical vapor deposition apparatus as defined in claim 1, wherein said manifold means and cooling means are fabricated from stainless steel.

10. Chemical vapor deposition apparatus as defined in claim 1, further including additional manifold means disposed within said reactor for receiving oxygen and having a plurality of openings therein for evenly distributing said received oxygen in the vicinity of said substrates, whereby said vapors react with the oxygen at said substrate surfaces at said predetermined reaction temperature causing said film to be deposited thereon.

11. Chemical vapor deposition apparatus as defined in claim 10, wherein said reaction temperature is in the range of from 300° C. to 450° C., and said reactive vapors consist of $SiH_4$, $PH_3$ and $B_2H_6$ which react with the oxygen, thereby depositing a Boro-Phosphoro-Silica-Glass film on said substrate surfaces at said reaction temperature.

12. Chemical vapor deposition apparatus, as defined in claim 1, wherein said means for heating is comprised of means for radiating heat through walls of said reactor having a sufficiently large surface area in relation to the surface area of said cooling means to substantially eliminate heat transfer between said reactor and said manifold means.

13. Chemical vapor deposition apparatus as defined in claim 1, wherein said means for heating is comprised of means for radiating heat through walls of said reactor having approximately one hundred times the surface area of said cooling means, thereby reducing to a negligible amount heat transfer between said reactor and said manifold means.

14. Chemcical vapor deposition apparatus as defined in claim 1, wherein said reactor has a length direction and said manifold means has a length extending along the length direction, and wherein said plurality of openings extend along the length of the manifold means.

* * * * *